US012765203B2

(12) United States Patent
Jeong et al.

(10) Patent No.: US 12,765,203 B2
(45) Date of Patent: Oct. 13, 2026

(54) LIGHT EMITTING DISPLAY APPARATUS WITH AUXILIARY METAL LAYERS IN CONTACT WITH ELECTRODES OF THIN FILM TRANSISTOR

(71) Applicant: LG Display Co., Ltd., Seoul (KR)

(72) Inventors: Mijin Jeong, Paju-si (KR); Sangsoon Noh, Paju-si (KR); Dongchae Shin, Paju-si (KR); Sunyoung Choi, Paju-si (KR); Moonho Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 442 days.

(21) Appl. No.: 18/353,807

(22) Filed: Jul. 17, 2023

(65) Prior Publication Data

US 2024/0074265 A1 Feb. 29, 2024

(30) Foreign Application Priority Data

Aug. 31, 2022 (KR) ........................ 10-2022-0110194

(51) Int. Cl.
*H10K 59/131* (2023.01)

(52) U.S. Cl.
CPC ................................ *H10K 59/1315* (2023.02)

(58) Field of Classification Search
CPC .................................................. H10K 59/1315
USPC ........................................................... 257/72
See application file for complete search history.

(56) References Cited

U.S. PATENT DOCUMENTS 10,998,348 B2 5/2021 Um et al.
2020/0185428 A1* 6/2020 Um .................... H10K 59/1216
2021/0202634 A1 7/2021 Moon et al.
2022/0208911 A1* 6/2022 Cho ..................... H10K 59/124

FOREIGN PATENT DOCUMENTS

KR 10-2020-0068439 A 6/2020
KR 10-2021-0086247 A 7/2021

* cited by examiner

*Primary Examiner* — Xia L Cross
(74) *Attorney, Agent, or Firm* — Fenwick & West LLP

(57) ABSTRACT

Disclosed is a light emitting display device, including: a first thin film transistor including a first semiconductor pattern, a first gate electrode, a first source electrode, and a first drain electrode; a second thin film transistor including a second semiconductor pattern, a second gate electrode, a second source electrode, and a second drain electrode; and a light emitting element layer electrically connected to the second thin film transistor, and the second thin film transistor may further include the second source electrode and an auxiliary metal layer contacting a lower portion of the second drain electrode.

13 Claims, 4 Drawing Sheets

LIGHT EMITTING DISPLAY APPARATUS WITH AUXILIARY METAL LAYERS IN CONTACT WITH ELECTRODES OF THIN FILM TRANSISTOR

CROSS REFERENCE TO RELATED APPLICATION

The present application claims priority to the Republic of Korea Patent Application No. 10-2022-0110194, filed Aug. 31, 2022, the entire contents of which are incorporated herein by reference in their entirety.

TECHNICAL FIELD

The present disclosure relates to a light emitting display device, and relates to a light emitting display device including a plurality of thin film transistors for improving drive stability of the light emitting display device.

BACKGROUND

Various shapes and functions are required for recent display devices which display information and interact with a user.

Examples of display devices include a liquid crystal display ("LCD"), an electrophoretic display device ("FPD"), and a light emitting diode display device ("LED").

A light emitting display (LED) device is a self-luminance display device and does not need a separate light source unlike a liquid crystal display device. Accordingly, the LED device can be made lighter and thinner. In addition, the LED device is advantageous in terms of power consumption since it is driven with low DC voltage. Also, the LED device has excellent color expression ability, a high response speed, a wide color viewing angle, and a high contrast ratio (CR). Therefore, the LED device has been researched as a next-generation display device.

Although the description will be made on the assumption that the light emitting display device is an organic light emitting display device, the type of light emitting element layer is not limited thereto.

A light emitting display device has an anode electrode, a light emitting element layer, and a cathode electrode. When a voltage is applied to the anode electrode and the cathode electrode, respectively, the hole and the electron are moved to the light emitting layer from the anode electrode and the cathode electrode, respectively. The light emitting layer emits light as excitons are generated by the combination of electrons and holes and dropped from an exited state to a ground state.

A plurality of driving circuits may be disposed in an active area of the substrate to control an operation of the light emitting element layer. The light emitting element layer may be electrically connected to the driving circuits. The driving circuits may supply a driving current corresponding to a data signal to the light emitting element layer according to a scan signal. For example, the plurality of driving circuits may include a plurality of thin film transistors and storage capacitors.

In the plurality of thin film transistors, different types of semiconductor patterns or hybrid type thin film transistors may be disposed. Since different types of semiconductor patterns have different contact resistances, the uniformity of the contact resistance is lowered, which causes a problem in that the luminance of the light emitting display device is lowered. Although various studies have been conducted to improve stability of the thin film transistor, development thereof is urgently required because it is still insufficient.

An object to be achieved by the present disclosure is to provide a light emitting display device in which at least one of the different types of thin film transistors includes an auxiliary metal layer in order to secure uniformity of contact resistances of the different types of the thin film transistors.

Another object to be achieved by the present disclosure is to provide a light emitting display device having different types of semiconductor patterns included in different types of thin film transistors in contact with different types of metal layers of a source electrode and a drain electrode in order to secure uniformity of contact resistance of different types of thin film transistors.

Another object to be achieved by the present disclosure is to provide a light emitting display device in which a distance of a blocking layer disposed under the driving thin film transistor is disposed smaller than a distance of a blocking layer disposed under another type of a thin film transistor, in order to solve a problem of screen stains occurring in low gray levels in a driving thin film transistor including an oxide semiconductor pattern.

A light emitting display device according to an embodiment of the present disclosure includes: a first thin film transistor comprising a first semiconductor pattern, a first gate electrode, a first source electrode, and a first drain electrode; a second thin film transistor comprising a second semiconductor pattern, a second gate electrode, a second source electrode, and a second drain electrode; a light emitting element layer electrically connected to the second thin film transistor, and the second thin film transistor further includes the second source electrode and an auxiliary metal layer contacting a lower portion of the second drain electrode.

In the light emitting display device according to an embodiment of the present disclosure, at least one of the different types of thin film transistors may include an auxiliary metal layer to ensure uniformity of contact resistance of the plurality of thin film transistors.

In the light emitting display device according to an embodiment of the present disclosure, since each semiconductor pattern included in the plurality of thin film transistors contacts different types of metal layers of the source electrode and the drain electrode, uniformity of contact resistance of the plurality of thin film transistors can be secured.

The light emitting display device according to an embodiment of the present disclosure may improve stability and display quality of a light emitting display device by preventing or at least reducing a likelihood of a problem in which uniformity of contact resistance of a plurality of thin film transistors deteriorate.

In the light emitting display device according to an embodiment of the present disclosure, a distance of a blocking layer disposed under the driving thin film transistor including an oxide semiconductor pattern is disposed smaller than a distance of a blocking layer disposed under another type of a thin film transistor, by reducing a current fluctuation rate of the driving thin film transistor including the oxide semiconductor pattern, it is possible to solve a problem of screen stains occurring in low gray levels of the driving thin film transistor including the oxide semiconductor pattern.

Effects which may be obtained by the present disclosure are not limited to the aforementioned effects, and other effects not described above may be evidently understood by a person having ordinary skill in the art to which the present disclosure pertains from the following description.

DETAILED DESCRIPTION

Figure 1:
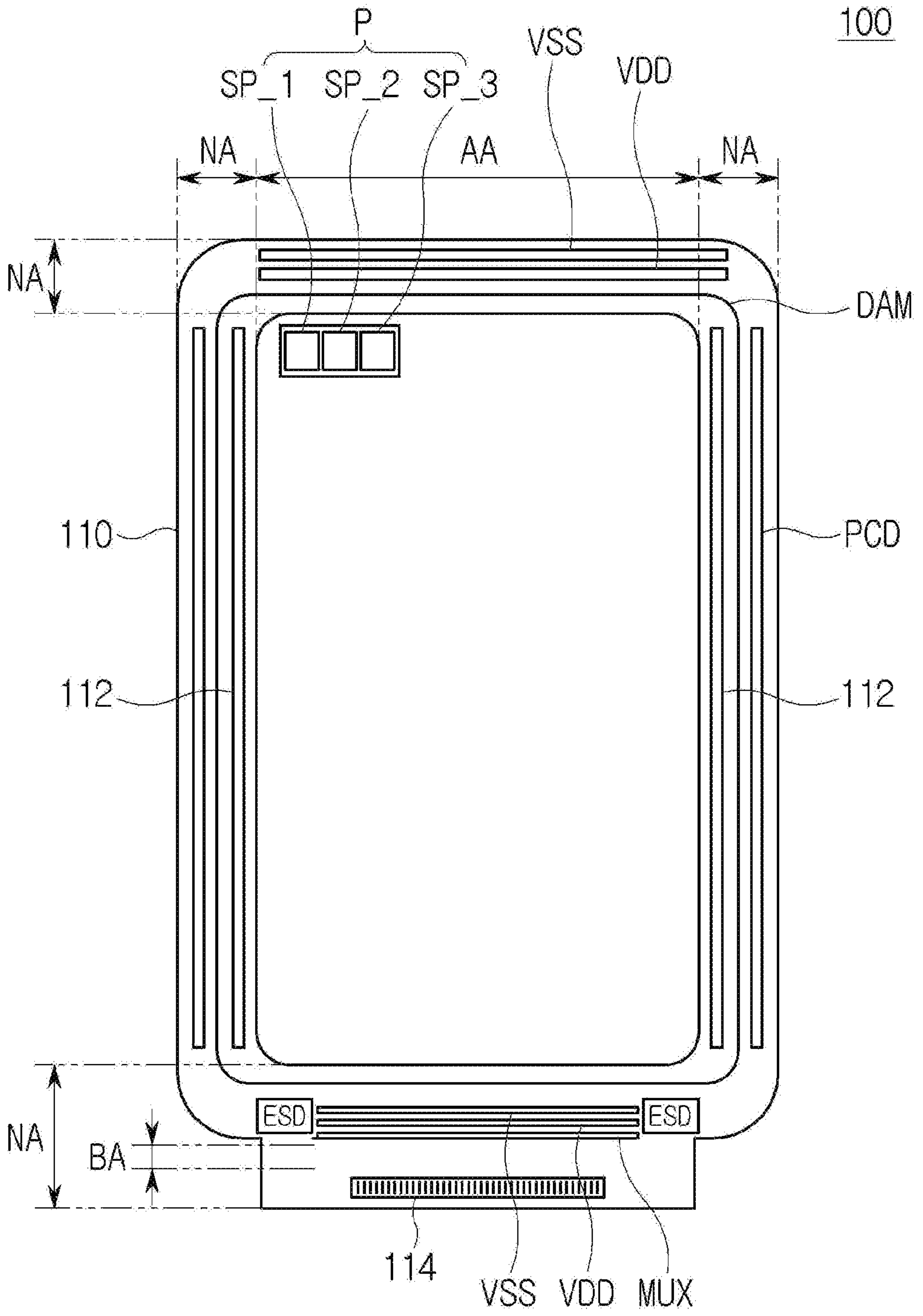
FIG. 1 is a plan view of a light emitting display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. These embodiments are provided so that this disclosure will be thorough and complete, and will fully convey exemplary implementations to those skilled in the art. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprise" used herein are generally intended to allow other components to be added unless the terms are used with the term "only". Any references to singular may include plural unless expressly stated otherwise. Any references to singular may include plural unless expressly stated otherwise.

In construing an element, the element is construed as including an error range although there is no explicit description.

When the position relation between two parts is described using the terms such as "on", "above", "below", and "next", one or more parts may be positioned between the two parts unless the terms are used with the term "immediately" or "directly" is not used.

In describing a time relationship, for example, when the temporal order is described as 'after', 'subsequent', 'next', and 'before', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The expression that an element is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

In the present disclosure, examples of a display apparatus are used to encompass a display apparatus such as a liquid crystal module (LCM) or an organic light-emitting display module (OLED), that may include a display panel and a driving unit for driving the display panel. The display apparatus is used to further encompass a set device (or a set apparatus) or a set electronic apparatus, as a finished product, such as a notebook computer or a laptop computer, a television set, a computer monitor, an equipment apparatus (e.g., display equipment in an automotive apparatus or another type of vehicle apparatus) or a mobile electronic apparatus that is a complete product or a final product (for example, a smartphone or an electronic pad, etc.) that may include the LCM or the OLED module.

Therefore, in the present disclosure, the display apparatus is used display apparatus itself, such as the LCM or the OLED module, and also a set apparatus which is a final consumer apparatus or an application product including the LCM or the OLED module.

In some example embodiments, the LCM or the OLED module including a display panel and a driving unit thereof may be referred to as a display apparatus, and the electronic apparatus as a final product including the LCM or the OLED module may be referred to as a set apparatus. For example, the display apparatus may include a display panel, such as an LCD or an OLED, and a source printed circuit board (PCB) as a controller for driving the same, the set apparatus may further include a set PCB that is a set controller set to be electrically connected to the source PCB and to control the overall operations of the set apparatus.

A display panel applied to an embodiment may use all types of display panels, such as a liquid crystal display panel, an organic light-emitting diode (OLED) display panel, and an electroluminescent display panel, but is not limited to these specific types. For example, the display panel of the present disclosure may be any panel capable of being vibrated by a sound generation device according to embodiments of the present disclosure to output a sound. A shape or a size of a display panel applied to a display apparatus according to embodiments of the present disclosure is not limited.

Features of various embodiments of the present disclosure may be partially or overall coupled to or combined with each other, and may be variously inter-operated with each other and driven technically. The embodiments of the present disclosure may be carried out independently from each other, or may be carried out together in co-dependent relationship.

Hereinafter, the embodiments of the present disclosure are described with reference to the accompanying drawings and examples as follows. For convenience of description, a scale of each of elements illustrated in the accompanying drawings differs from a real scale, and thus, is not limited to a scale illustrated in the drawings.

Hereinafter, embodiments of the present disclosure will be described in detail with reference to the accompanying drawings.

FIG. 1 is a plan view of a light emitting display device according to an embodiment of the present disclosure.

Referring to FIG. 1, the light emitting display device according to the present disclosure may include a variety of additional elements for generating various signals or for driving a plurality of sub-pixels (SP_1, SP_2, SP_3) in the active area AA. For example, one or more driving circuits for controlling the display panel may be included in the light emitting display device 100. A driving circuit for controlling (or driving) the sub-pixels (SP_1, SP_2, and SP_3) includes a gate driver 112, data signal lines, a multiplexer (MUX), an electrostatic discharge (ESD) circuit, and a high-potential voltage line VDD, a low-potential voltage line VSS, an inverter circuit, and the like. The light emitting display device 100 may also may include elements associated with features other than driving the sub-pixels (SP_1, SP_2, and SP_3). For example, the light emitting display device 100 may include additional elements for providing a touch sense feature, a user authentication feature (e.g., fingerprint recognition), a multi-level pressure sense feature, a tactile feedback feature, etc. The above-mentioned additional elements may be disposed in non-active areas NA and/or an external circuit connected to the connection interface.

A substrate 110 may include an active area AA and a non-active area NA. The active area AA is an area in which a plurality of pixels P are formed to display an image. The non-active area NA is an area in which an image is not displayed. For example, the non-active area NA may be a bezel area, but the term is not limited thereto. The non-active area NA may be adjacent to the active area AA and disposed outside the active area AA. Alternatively, the non-active area NA may be disposed to surround all or part of the active area AA. Alternatively, the non-display area NA may be an area in which the plurality of sub-pixels (SP_1, SP_2, SP_3) are not disposed, but is not limited thereto.

The pixel P disposed in the active area AA may further include a plurality of sub-pixels (SP_1, SP_2, SP_3). The sub-pixels (SP_1, SP_2, SP_3) are individual units that emit light, and the plurality of sub-pixels SP include a red sub-pixel SP_R, a green sub-pixel SP_G, a blue sub-pixel SP_B, and/or a white sub-pixel SP_B, and the like, but is not limited thereto.

Each sub-pixel (SP_1, SP_2, SP_3) is formed with an organic light emitting diode and a driving circuit. For example, a display element for displaying an image and a driving circuit for driving (or controlling) the display element may be disposed in the plurality of subpixels (SP_1, SP_2, SP_3).

One sub-pixel SP may include a plurality of transistors and capacitors and a plurality of wirings. For example, the subpixel SP may include two transistors and one capacitor (2T1C), but is not limited thereto, and may be implemented as a sub-pixel to which 3T1C, 4T1C, 5T1C, 6T1C, 7T1C, 3T2C, 4T2C, 5T2C, 6T2C, 7T2, 8T2C, and the like are applied.

The non-active area NA is an area where various wirings and driving circuits for driving the plurality of subpixels (SP_1, SP_2, SP_3) disposed in the active area AA are disposed. For example, various ICs and driving circuits such as the gate driver 112 and the data driver may be disposed in the non-active area NA.

In FIG. 1, the non-active area NA surrounds the rectangular active area AA, but a shape of the active area AA and a shape and arrangement of the non-active area NA adjacent to the active area AA are not limited to the example shown in FIG. 1. The active area AA and the non-active area NA may have shapes suitable for a design of an electronic device in which the light emitting display device 100 is mounted. In the case of a display device of a wearable device by a user, the active area AA may have a circular shape like a general wrist watch, and concepts of the embodiments of the present disclosure may also be applied to a free-form display device applicable to a vehicle instrument panel or the like. Exemplary shapes of the active area AA may be pentagonal, hexagonal, octagonal, circular, or elliptical, but are not limited thereto.

A bending area BA may be provided in a portion of the non-active area NA. The bending area BA may be provided between a pad part 114 located in the active area AA and the non-active area NA. Also, the bending area BA may be an area in which a connection wiring part is formed.

The bending area BA may be an area in which a portion of the substrate 110 is bent in order to dispose the pad part 114 and an external module bonded to the pad part 114 on a rear side of the substrate 110. For example, as the bending area BA is bent toward a rear surface of the substrate 110, the external module bonded to the pad part 114 of the substrate 110 moves toward the rear surface of the substrate 110, and the external module may not be recognized when viewed from a top of the substrate 110. Also, as the bending area BA is bent, a size of the non-active area NA visible from above the top of the substrate 110 is reduced, so that a narrow bezel may be implemented. In the present disclosure, it is illustrated that the bending area BA is present in the non-active area NA, but is not limited thereto. For example, the bending area BA may be located in the active area AA, and since the active area AA itself may be bent in various directions, the bending area BA located in the active area AA may have the effect mentioned in the present disclosure.

The pad part 114 is disposed on one side of the non-active area NA. The pad part 114 is a metal pattern to which the external module, for example, a flexible printed circuit board (FPCB) and a chip-on-film (COF) and the like are bonded. Although the pad part 114 is illustrated as being disposed on one side of the substrate 110, a shape and arrangement of the pad part 114 are not limited thereto.

The gate driver 112 providing a gate signal of the thin film transistor may be disposed on the other side of the non-active area NA. The gate driver 112 includes various gate driving circuits, and the gate driving circuits may be formed directly on the substrate 110. In this case, the gate driver 112 may be a gate-in-panel (GIP).

The gate driver 112 may be disposed between a dam disposed in the active area and the non-active area NA of the substrate 110.

Between the pad part 114 of the active area AA and the non-active area NA, the high-potential voltage line VDD, the low-potential voltage line VSS, the multiplexer (MUX), an ESD (Electrostatic Discharge) protection circuit region, and a plurality of connection wiring parts may be disposed.

The high potential voltage line VDD, the low potential voltage line VSS, the multiplexer (MUX), and the ESD protection circuit region may be disposed between the active area AA and the bending area BA.

The connection wiring part may be disposed in the non-active area NA. For example, the connection wiring part may be disposed in the bending area BA where the substrate is bent in the non-active area NA. The connection wiring part may be a component for transferring a signal (voltage) from an external module bonded to the pad part 114 to the active area AA or a circuitry such as the gate driver 112. For example, through the connection wiring part, various signals for driving the gate driver 112, various signals such as data signals, high-potential voltages, and low-potential voltages may be transferred.

The dam may be disposed in the non-active area NA to surround all or part of the active area AA. The dam may be disposed adjacent to the active area AA, but outside the active area AA.

The dam may be disposed along a periphery of the active area AA to control a flow of an organic layer, which is a material of a second encapsulation layer among encapsulation layers to be described below, disposed on the light emitting element layer. The dam may be one or comprise a plurality.

The dam may be disposed among the active area AA, the high potential voltage line VDD, the low potential voltage line VSS, the multiplexer (MUX), or the ESD protection circuit region.

A panel crack detector (PCD) may be further disposed on a portion of the non-active area NA of the substrate 110.

The panel crack detector (PCD) may be disposed between an end point (or end) of the substrate 110 and the dam. Alternatively, the panel crack detector PCD may be disposed under the dam and at least partially overlap the dam.

Hereinafter, the light emitting display device of the present disclosure will be described in detail with reference to FIGS. 2 and 3.

Figure 2:
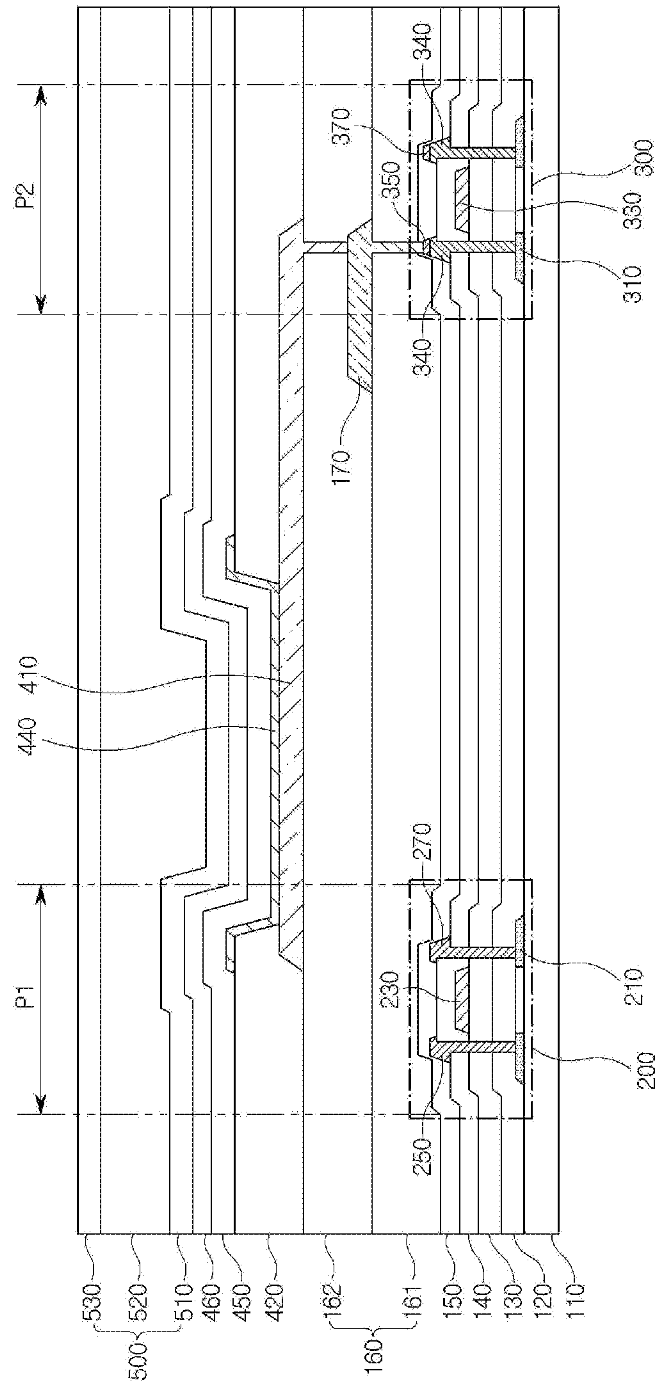
FIG. 2 is a cross-sectional view of a light emitting display device according to an embodiment of the present disclosure.

FIG. 2 is a cross-sectional view of the light emitting display device according to the embodiment of the present disclosure. FIG. 3 is an enlarged cross-sectional view of the thin film transistor of FIG. 2.

Figure 3:
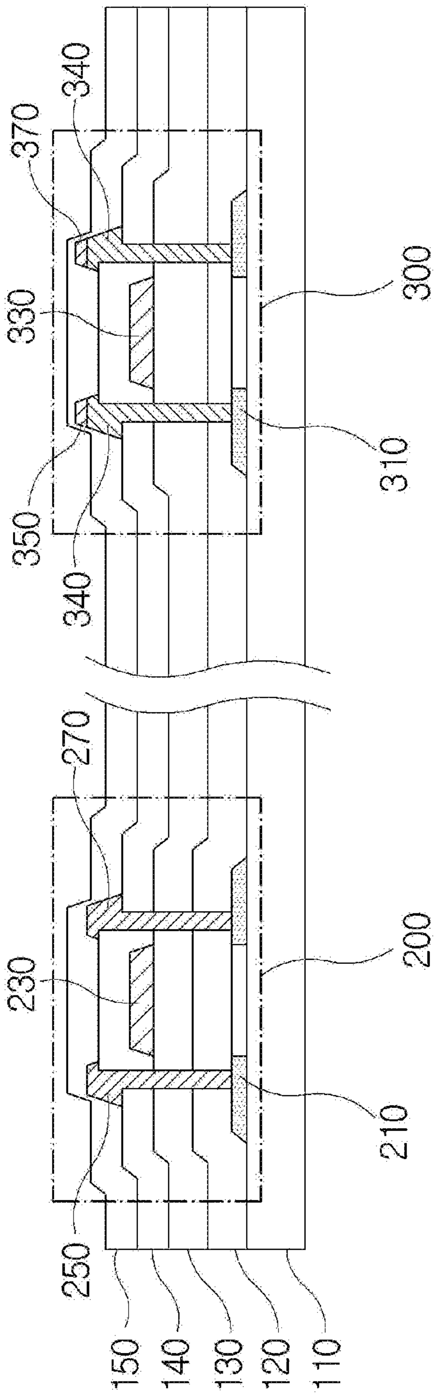
FIG. 3 is an enlarged cross-sectional view of the thin film transistor of FIG. 2 according to an embodiment of the present disclosure.

Referring to FIGS. 2 and 3, the active area AA of the substrate 110 may include a first thin film transistor 200 and a second thin film transistor 300 including an auxiliary metal layer 340.

The first thin film transistor 200 may be disposed on a first region P1 of the substrate 110, and the second thin film transistor 300 may be disposed on a second region P2.

The first area P1 and the second area P2 may be disposed within the active area AA. For example, the first thin film transistor 200 and the second thin film transistor 300 may be disposed in one sub-pixel SP. The first thin film transistor 200 may be a switching thin film transistor. The second thin film transistor 300 may be a driving thin film transistor. As another example, the first thin film transistor 200 may be a driving thin film transistor, and the second thin film transistor 300 may be a switching thin film transistor.

The first region P1 and the second region P2 may be different regions on the substrate. The first region P1 and the second region P2 may be disposed in the active area or the non-active area. For example, the first thin film transistor 200 may be disposed in the non-active area and the second thin film transistor 300 may be disposed in the active area, but are not limited thereto.

The substrate 110 may support various components of the light emitting display device. The substrate 110 may be made of glass or plastic material having flexibility.

For example, the substrate 110 may be formed of at least one or more of polyimide (PI), polymethylmethacrylate (PMMA), polyethylene terephthalate (PET), polyethersulfone, and polycarbonate, but is not limited thereto.

When the substrate 110 is formed of polyimide, the substrate 110 may be composed of two pieces of polyimide. In addition, an inorganic film may be further disposed between the two polyimide pieces.

The substrate 110 may be referred to as a concept including elements and functional layers formed on the substrate 110, for example, a switching thin film transistor, a driving thin film transistor connected to the switching thin film transistor, a light emitting element layer connected to the driving thin film transistor, a protective layer, and the like, but is not limited thereto.

A buffer layer 120 may be disposed on the entire surface of the substrate 110.

The buffer layer 120 may be formed of an insulating inorganic material such as silicon nitride (SiNx) or silicon oxide (SiOx), and may be formed of an insulating organic material, and the like, but is not limited thereto.

The buffer layer 120 may be formed as a single layer or a multi-layer using silicon nitride (SiNx) or silicon oxide (SiOx). When the buffer layer 120 is formed of multiple layers, silicon oxide (SiOx) and silicon nitride (SiNx) may be alternately formed.

The buffer layer 120 may be omitted depending on a type and material of the substrate 110 and a structure and type of the thin film transistor.

The first thin film transistor 200 may be disposed in the first region P1 of the buffer layer 120, and the second thin film transistor 300 may be disposed in the second region P2.

The first thin film transistor 200 may include a first semiconductor pattern 210, a first gate electrode 230, a first source electrode 250, and a first drain electrode 270.

The second thin film transistor 300 may include a second semiconductor pattern 310, a second gate electrode 330, a second source electrode 350 and a second drain electrode 370. Each of the second source electrode 350 and the second drain electrode 370 may be electrically connected to the auxiliary metal layer 340.

The first semiconductor pattern 210 may be disposed in the first region P1 and the second semiconductor pattern 310 may be disposed in the second region P2 on the buffer layer 120.

The first semiconductor pattern 210 may be formed of a polycrystalline semiconductor. For example, the polycrystalline semiconductor may be made of low temperature polysilicon (LTPS) having high mobility, but is not limited thereto. When the semiconductor pattern is formed of a polycrystalline semiconductor, energy consumption is low and reliability is excellent.

The second semiconductor pattern 310 may be formed of an oxide semiconductor. When a polycrystalline semiconductor pattern, which is advantageous for high-speed operation of a driving thin film transistor, is used as a semiconductor pattern, leakage current occurs in the off state, resulting in high power consumption. Accordingly, semiconductor pattern may be formed of oxide, which is advantageous for blocking occurrence of a leakage current.

Since an oxide semiconductor material has a larger bandgap than a silicon semiconductor material, electrons cannot cross the bandgap in the off state, and thus the off-current is low.

The off-current is the leakage current between the source electrode and the drain electrode of the thin film transistor when the thin film transistor is in the off state. When the driving thin film transistor is formed of an oxide semiconductor material having a low off-current, an effect of blocking a leakage current is excellent even when the off-state is long, so that a change in luminance of a sub-pixel may be minimized or at least reduced during low-speed driving. In addition, since the leakage current is low in the off state, power consumption may be reduced.

For example, the second semiconductor pattern 310 may be made of metal oxide. For example, the second semiconductor pattern 310 may be made of any one among indium-gallium-zinc-oxide (IGZO), indium-zinc-oxide (IZO), indium-gallium-tin-oxide (IGTO), and indium-gallium-oxide (IGO), but is not limited thereto.

When the first semiconductor pattern 210 and the second semiconductor pattern 310 are formed of a polycrystalline semiconductor or an oxide semiconductor, some regions of the first semiconductor pattern 210 and the second semiconductor pattern 310 may have a conductorized area.

The first semiconductor pattern 210 may contact the first source electrode 250 and the second drain electrode 270.

The second semiconductor pattern 310 may be electrically connected to the second source electrode 350 and the second drain electrode 370 through the auxiliary metal layer 340.

Since a material forming the first semiconductor pattern 210 is low-temperature polysilicon and a material forming the second semiconductor pattern 310 is oxide, contact resistances generated on each surface of each semiconductor pattern in contact with the electrodes (source electrode and drain electrode), respectively, may be different from each other. For example, when it comes to the contact resistance generated on the surface where the first semiconductor pattern 210 including the low temperature polysilicon material contacts the first source electrode 250 and the second source electrode 270, unlike the examples shown in FIGS. 2 and 3, in an assumption where the second source electrode 350 and the second drain electrode 370 directly contact the second semiconductor pattern 310, contact resistances generated on surfaces where the second semiconductor pattern 310 including an oxide material contacts the second source electrode 350 and the second drain electrode 370 may be different from each other.

As suggested in this embodiment, the auxiliary metal layer 340 may be further formed between the second semiconductor pattern 310 and the second source electrode 350 and between the second semiconductor pattern 310 and the second drain electrode 370. For example, lower portions of the second source electrode and the second drain electrode may be in contact with the auxiliary metal layer. Also, the auxiliary metal layer 340 may be formed of a material different from a material forming the first source electrode 250 and a material forming the first drain electrode 270. In addition, a material of the auxiliary metal layer 340 may be determined such that the contact resistance among the first semiconductor pattern 210 and the electrodes 250 and 270 and the contact resistance between the second semiconductor pattern 310 and the auxiliary metal layer 340 are equal to or similar to each other. Accordingly, even though the first thin film transistor 200 and the second thin film transistor 300 are formed of different semiconductor materials, uniformity of contact resistance may be increased.

Furthermore, according to the present embodiment, the second source electrode 350 and the second drain electrode 370 may be additionally disposed on the auxiliary metal layer 340. In this case, the material of the second source electrode 350 and the second drain electrode 370 may be the same as that of the first source electrode 250 and the first drain electrode 270. For example, unlike the present embodiment, when the second source electrode 350 and the second drain electrode 370 are not disposed on the auxiliary metal layer 340, a material forming the drain electrode and the source electrode constituting the second thin film transistor 300 is changed to a material of the auxiliary metal layer 340, a problem may occur due to the change of operating characteristics of the second thin film transistor 300. However, according to this embodiment, the operating characteristics of the second thin film transistor 300 may not be changed.

As a result, in the light emitting display device, since each semiconductor pattern included in the plurality of thin film transistors contacts different types of metal layers of the source electrode and the drain electrode, it is possible to secure uniformity of contact resistance of the plurality of thin film transistors. In addition, it is possible to maintain the operating characteristics of the plurality of thin film transistors without being changed.

A first insulating layer 130 may be disposed on the first semiconductor pattern 210 and the second semiconductor pattern 310.

The first insulating layer 130 may be disposed between the first semiconductor pattern 210 and the first gate electrode 230 to insulate the first semiconductor pattern 210 from the first gate electrode 230.

The first insulating layer 130 may be disposed between the second semiconductor pattern 310 and the second gate electrode 330 to insulate the second semiconductor pattern 310 from the second gate electrode 330.

The first insulating layer 130 may be formed of an insulating inorganic material such as silicon nitride (SiNx) or silicon oxide (SiOx), and may be formed of an insulating organic material, and the like, but is not limited thereto.

The first insulating layer 130 may have holes to electrically connect each of the first source electrode 250 and the first drain electrode 270 to the first semiconductor pattern 210. The first insulating layer 130 may have holes to electrically connect the auxiliary metal layer 340 to the second semiconductor pattern 310.

The first gate electrode 230 may be disposed in the first region P1 of the first insulating layer 130, and the second gate electrode 330 may be disposed in the second region P2 thereof.

The first gate electrode 230 may be disposed to overlap the first semiconductor pattern 210. The second gate electrode 330 may be disposed to overlap the second semiconductor pattern 310.

The first gate electrode 230 and the second gate electrode 330 may be formed as a single layer or a multi-layer using any one among molybdenum (Mo), copper (Cu), titanium (Ti), aluminum (Al), chromium (Cr), gold (Au), or nickel (Ni), neodymium (Nd), tungsten (W), gold (Au), and transparent conductive oxide (TCO), or alloys thereof, but are limited thereto.

A second insulating layer 140 may be disposed on the first gate electrode 230 and the second gate electrode 330.

The second insulating layer 140 is disposed among the first gate electrode 230, the first source electrode 250, and the first drain electrode 270, and may insulate the first gate electrode 230 and the first source electrode 250 and the first drain electrode 270 from each other.

The second insulating layer 140 is disposed among the second gate electrode 330, the second source electrode 350, and the second drain electrode 370, and may insulate the second gate electrode 330, the second source electrode 350 and the second drain electrode 370 from each other.

The second insulating layer 140 may be formed of an insulating inorganic material such as silicon nitride (SiNx) or silicon oxide (SiOx), and may be formed of an insulating organic material, and the like, but is not limited thereto.

The second insulating layer 140 may have holes to electrically connect each of the first source electrode 250 and the first drain electrode 270 to the first semiconductor pattern 210.

The second insulating layer 140 may have holes to electrically connect the auxiliary metal layer 340 to the second semiconductor pattern 310.

The auxiliary metal layer 340 may be disposed in the plurality of holes provided in the second insulating layer 140 in the second region P2. The second thin film transistor 300 may further include the auxiliary metal layer 340. The auxiliary metal layer 340 may electrically connect the second semiconductor pattern 310, the second source electrode 350 and the second drain electrode 370.

The auxiliary metal layer 340 may not be disposed in the first region P1. For example, the auxiliary metal layer 340 may not be included in the first thin film transistor 200.

The auxiliary metal layer 340 may include molybdenum (Mo).

The auxiliary metal layer 340 may also be referred to as a component of the second source electrode 350 and the second drain electrode 370 to be described later. In this case, the second source electrode 350 and the second drain electrode 370 may further include at least one or more metal layers than the first source electrode 250 and the first drain electrode 270. For example, the first source electrode 250 and the first drain electrode 270 may have a three-layer structure, and the second source electrode 350 and the second drain electrode 370 may have a four-layer structure.

The first source electrode 250 and the first drain electrode 270 may be disposed in the first region P1 on the second insulating layer 140. The second source electrode 350 and the second drain electrode 370 may be disposed in the second region P2 on the second insulating layer 140 and the auxiliary metal layer 340, respectively.

The first source electrode 250 and the first drain electrode 270 may be electrically connected to the first semiconductor pattern 210 through the holes in the first insulating layer 130 and the second insulating layer 140.

The second source electrode 350 and the second drain electrode 370 may be electrically connected to the second semiconductor pattern 310 through the auxiliary metal layer 340 disposed in the holes of the first insulating layer 130 and the second insulating layer 140. For example, lower portions of the second source electrode 350 and the second drain electrode 370 may be in contact with the auxiliary metal layer.

The first source electrode 250, the first drain electrode 270, the second source electrode 350, and the second drain electrode 370 may be formed as a single layer or a multi-layer using one among molybdenum (Mo), copper (Cu), titanium (Ti), aluminum (Al) any one of chromium (Cr), gold (Au), nickel (Ni), neodymium (Nd), tungsten (W), gold (Au), and transparent conductive oxide (TCO) or an alloy thereof, but are not limited thereto.

For example, the source electrode 250 and the drain electrode 270 may be formed of a conductive metal material and may have a three-layer structure of titanium (Ti), aluminum (Al), and titanium (Ti), but are not limited thereto.

A protective layer 150 may be disposed on the first source electrode 250, the first drain electrode 270, the second source electrode 350, and the second drain electrode 370.

The protective layer 150 may protect the first thin film transistor 200 and the second thin film transistor 300. The protective layer 150 may be formed of an insulating inorganic material such as silicon nitride (SiNx) or silicon oxide (SiOx), and may be formed of an insulating organic material, and the like, but is not limited thereto.

The protective layer 150 may have holes to electrically connect the second thin film transistor 300 and an anode electrode 410 to each other.

The protective layer 150 may be omitted depending on a structure and type of the thin film transistor.

A planarization layer 160 may be disposed on the protective layer 150 or on the first thin film transistor 200 and the second thin film transistor 300.

The planarization layer 160 may protect thin film transistors disposed under the planarization layer 160 and alleviate or planarize step differences caused by various patterns.

The planarization layer 160 may be formed of at least one or more of organic insulating materials such as benzocyclobutene (BCB), acrylic resin, epoxy resin, phenolic resin, polyamide resin, or polyimide resin, but is not limited thereto.

The planarization layer 160 may be disposed as a single layer, but may be disposed as a two or more layers in consideration of the arrangement of electrodes.

As the light emitting display device 100 evolves to achieve a higher resolution, the number of various signal lines is increased. Therefore, it is difficult to arrange all the lines in a single layer while ensuring a minimum or at least a reduced gap between the lines, thus, an additional layer may be required. This extra layer provides sufficient room for signal line arrangement, which makes it easier to design the signal lines/electrodes arrangement. Further, when a dielectric material is used for the planarization layers formed as multi-layers, the planarization layer 160 may be used for the purpose of forming capacitances between the planarization layers and the metal layers.

When the planarization layer 160 is arranged in two layers, the planarization layer 160 may include a first planarization layer 161 and a second planarization layer 162.

For example, a hole may be formed in the first planarization layer 161 and the connection electrode 170 may be disposed in the hole. A second planarization layer 162 having holes may be disposed on the first planarization layer 161 and the connection electrode 170. The anode electrode 410 may be disposed in the hole of the second planarization layer 162. Accordingly, the thin film transistor 200 and the anode electrode 410 may be electrically connected through the connection electrode 170.

One end (or part) of the connection electrode 170 may be connected to the second thin film transistor 300, and the other end (or another part) of the connection electrode may be connected to the anode electrode 410.

The connection electrode 170 may be formed as a single layer or a multi-layer using any one among molybdenum (Mo), copper (Cu), titanium (Ti), aluminum (Al), chromium (Cr), gold (Au), or nickel (Ni), neodymium (Nd), tungsten (W), gold (Au), and transparent conductive oxide (TCO), or alloys thereof, but is limited thereto.

The connection electrode 170 may be omitted based on a structure and type of the light emitting display device.

The anode electrode 410 may be disposed on the planarization layer 160.

When the light emitting display device 100 is a top emission type, the anode electrode 410 may be a reflective electrode that reflects light and may be made of an opaque conductive material. The anode electrode 410 may be formed of at least one or more of silver (Ag), aluminum (Al), gold (Au), molybdenum (Mo), tungsten (W), chromium (Cr) or an alloy thereof. For example, the anode electrode 410 may be formed to have a three-layer structure including silver (Ag), lead (Pd) and copper (Cu), but is not limited thereto. Alternatively, the anode electrode 410 may further include a transparent conductive material layer having a high work function such as indium-tin-oxide (ITO).

When the light emitting display device 100 is a bottom emission type, the anode electrode 410 may be formed of a transparent conductive material that transmits light. For example, the anode electrode 410 may be formed of at least one or more of indium tin oxide (ITO) and indium zinc oxide (IZO).

A bank 420 may be disposed on the anode electrode 410 and the planarization layer 160.

The bank 420 may define a plurality of sub-pixels (SP), minimize or at least reduce light blurring, and prevent or at least reduce color mixing from occurring at various viewing angles.

The bank 420 may have a bank hole exposing the anode electrode 410.

The bank 420 may be made of at least one or more materials of an inorganic insulating material such as silicon nitride (SiNx) or silicon oxide (SiOx), an organic insulating material such as benzocyclobutene (BCB), acrylic resin, epoxy resin, phenolic resin, or polyamide resin or polyimide resin, or a photosensitizer including a black pigment, but is not limited thereto.

The bank 420 may be transparent, black, or colored.

The bank 420 may be disposed to cover an end of the anode electrode 410.

At least one spacer may be disposed in the bank 420. The spacer may minimize or at least reduce damage to the light emitting display device 100 from external impact. The spacer may be formed of the same material as that of the bank 420, or may be formed simultaneously with the bank 420 or may be formed in a separate process.

A light emitting element layer 440 may be disposed on the anode electrode 410 and the bank 420.

The light emitting element layer 440 may include a light emitting layer to emit light of a specific color. For example, the emission layer may include one among a red organic emission layer, a green organic emission layer, a blue organic emission layer, and a white organic emission layer. When the light emitting layer includes a white organic emission layer, a color filter for converting white light from the white organic emission layer into light of a different color may be further disposed on the light emitting element layer 440. In addition, the light emitting element layer 440 may further include various organic layers such as a hole transport layer, a hole injection layer, an electron injection layer and an electron transport layer, in addition to the organic emission layer, but is not limited thereto.

A cathode electrode 450 may be disposed on the light emitting element layer 440. The cathode electrode 450 supplies electrons to the light emitting element layer 440 and may be made of a conductive material having a low work function.

When the light emitting display device 100 is a top emission type, the cathode electrode 450 may be formed of a transparent conductive material that transmits light. For example, the cathode electrode 450 may be formed of at least one or more of indium tin oxide (ITO) and indium zinc oxide (IZO), but is not limited thereto.

In addition, the cathode electrode 450 may be formed of a translucent conductive material that transmits light. For example, the cathode electrode 450 may be formed of at least one or more of the following alloys. Examples of the alloys may include LiF/Al, CsF/Al, Mg:Ag, Ca/Ag, Ca:Ag, LiF/Mg:Ag, LiF/Ca/Ag, and LiF/Ca:Ag, but are not limited thereto.

When the light emitting display device 100 is a bottom emission type, the cathode electrode 450 may be a reflective electrode that reflects light and may be made of an opaque conductive material. For example, the cathode electrode 450 may be formed of at least one or more of silver (Ag), aluminum (Al), gold (Au), molybdenum (Mo), tungsten (W), chromium (Cr) or an alloy thereof.

A capping layer (CPL) 460 may be disposed on the cathode electrode 450.

The capping layer 460 is intended to protect the cathode electrode 450 and increase the light extraction effect of the light emitting element layer, and the capping layer 460 may be formed as a single layer or a multi-layer, but is not limited thereto.

The capping layer 460 may be omitted based on a structure and type of the light emitting display device.

An encapsulation layer 500 may be disposed on the cathode electrode 450 or the capping layer 460. The encapsulation layer 500 may protect the anode electrode 410, the light emitting element layer 440, and the cathode electrode 450 from external moisture, oxygen, or foreign matter or particles. For example, the encapsulation layer 500 may prevent or at least reduce penetration of oxygen and moisture from the outside so as to prevent or at least reduce oxidation of the light emitting material and the electrode material.

The encapsulation layer 500 may be made of a transparent material such that light emitted from the light emitting layer is transmitted.

The encapsulation layer 500 may include a first encapsulation layer 510, a second encapsulation layer 520, and a third encapsulation layer 530 that block penetration of moisture or oxygen. The first encapsulation layer 510, the second encapsulation layer 520, and the third encapsulation layer 530 may have an alternately stacked structure.

The first encapsulation layer 510 and the third encapsulation layer 530 may be formed of at least one or more inorganic materials among silicon nitride (SiNx), silicon oxide (SiOx), and aluminum oxide (AlyOz), but are not limited thereto. The first encapsulation layer 510 and the third encapsulation layer 530 may be formed using a vacuum deposition method such as chemical vapor deposition (CVD) or atomic layer deposition (ALD), but are not limited thereto.

The second encapsulation layer 520 may cover foreign substances or particles that may occur in the manufacturing process. In addition, the second encapsulation layer 520 may planarize a surface of the first encapsulation layer 510. For example, the second encapsulation layer 520 may be a particle cover layer, but the term is not limited thereto.

The second encapsulation layer 520 may be an organic material, for example, a polymer such as silicon oxycarbon (SiOCz) epoxy, polyimide, polyethylene, or acrylate, but is not limited thereto.

The second encapsulation layer 520 may be made of a thereto-curable material or photocurable material cured by heat or light.

Hereinafter, another embodiment of the present disclosure will be described with reference to FIG. 4.

Figure 4:
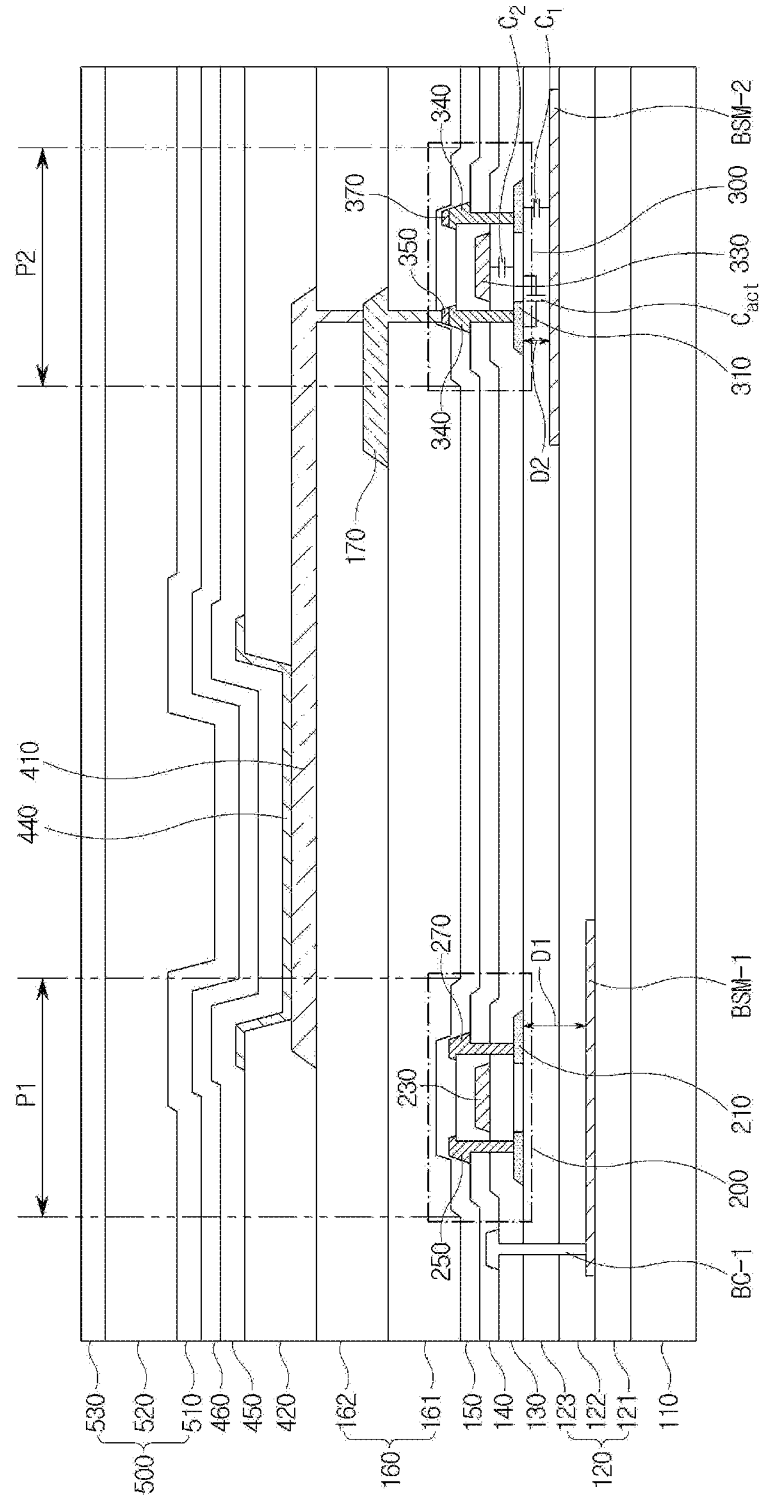
FIG. 4 is a cross-sectional view of a light emitting display device according to another embodiment of the present disclosure.

FIG. 4 is a cross-sectional view of the light emitting display device according to another embodiment of the present disclosure.

The light emitting display device 100 according to another embodiment of the present disclosure may further include a first blocking layer (BSM-1) and a second blocking layer (BSM-2).

Compared to the light emitting display device of FIG. 2, the light emitting display device 100 shown in FIG. 4 is substantially the same as the light emitting display device of FIG. 2 except for the buffer layer 120, the first blocking layer (BSM-1) and the second blocking layer (BSM-2), thus, repetitive description overlapping with the embodiment of FIG. 2 has been omitted.

A first blocking layer (BSM-1) may be disposed under the first thin film transistor 200, and a second blocking layer (BSM-2) may be disposed under the second thin film transistor 300. For example, the first blocking layer (BSM-1) may be disposed under the first semiconductor pattern 210 located in the first region P1 and may be disposed to overlap the first semiconductor pattern 210. The second blocking layer (BSM-2) may be disposed under the second semiconductor pattern 310 located in the second region P2 and may be disposed to overlap the second semiconductor pattern 310.

The first blocking layer (BSM-1) and the second blocking layer (BSM-2) may have areas larger than those of the first semiconductor pattern 210 and the second semiconductor pattern 310.

The blocking layer may prevent or at least reduce a likelihood of the semiconductor pattern from malfunctioning due to light incident from the outside of the light emitting display device being irradiated to the semiconductor pattern. In addition, the blocking layer may prevent or at least reduce an inflow of charges from the substrate 110. For example, when a voltage is applied to the gate electrode of the thin film transistor for a long time, the charge of the substrate flows into a channel region of the semiconductor pattern of the thin film transistor due to the electric field E generated in the thin film transistor, thereby changing a charge amount in the corresponding channel region. This may be referred to as a back channel phenomenon. Charges can be either holes or charges depending on the polarity of the electric field. The substrate may cause a change in the threshold voltage of the thin film transistor by changing the current of the thin film transistor. This may cause changes in the luminance of pixels and afterimages. Accordingly, an afterimage may be prevented or at least reduced by preventing or at least reducing a change in the threshold voltage (Vth) of the thin film transistor, by disposing a blocking layer between the substrate and the semiconductor pattern to block unwanted charge flow from the substrate to the thin film transistor. Further, it becomes possible to improve the display quality by securing the stability of the thin film transistor during driving by doing so.

The first blocking layer (BSM-1) and the second blocking layer (BSM-2) may be formed of an opaque conductive material to block light incident from an outside of the light emitting display device. For example, the first blocking layer (BSM-1) and the second blocking layer (BSM-2) may be formed as a single layer or a multi-layer using any one among molybdenum (Mo), copper (Cu), titanium (Ti), aluminum (Al), chromium (Cr), gold (Au), nickel (Ni), neodymium (Nd), tungsten (W), and gold (Au) or alloys thereof, but are not limited thereto.

The buffer layer 120 may include a first buffer layer 121, a second buffer layer 122, and a third buffer layer 123. The first buffer layer 121, the second buffer layer 122, and the third buffer layer 123 may be sequentially disposed.

The first blocking layer (BSM-1) may be disposed in the first region P1 and the second blocking layer (BSM-2) may be disposed in the second region P2. The first blocking layer (BSM-1) and the second blocking layer (BSM-2) may be on different layers. For example, the first blocking layer (BSM-1) may be disposed below the second blocking layer (BSM-2).

The first blocking layer (BSM-1) may be disposed in the first region P1 on the first buffer layer 121.

The first blocking layer (BSM-1) may be electrically connected to a first blocking layer connection electrode BC-1.

The second buffer layer 122 may be disposed on the first blocking layer (BSM-1).

The second blocking layer (BSM-2) may be disposed in the second region P2 on the second buffer layer 122.

The first semiconductor pattern 210 and the first blocking layer (BSM-1) may have a first vertical distance D1. The second semiconductor pattern 310 and the second blocking layer (BSM-2) may have a second vertical distance D2. The second vertical distance D2 may be smaller than the first vertical distance D1.

When the driving thin film transistor is made of an oxide semiconductor, due to the nature of a material of the oxide semiconductor, the current fluctuation value relative to a unit voltage fluctuation value is large, so failures often occur in a low gray scale region where precise current control is required. Therefore, in another embodiment of the present disclosure, it is possible to provide a driving thin film transistor in which a varying value of a current in the semiconductor pattern is relatively insensitive to the varying value of the voltage applied to the gate electrode.

A specific voltage may be applied to the second blocking layer (BSM-2). A voltage applied to the second blocking layer (BSM-2) may be different from a voltage applied to the second gate electrode 330. A constant voltage may be applied to the second blocking layer (BSM-2) regardless of the voltage applied to the second gate electrode 330. Therefore, a parasitic capacitance having a first capacitance C1 may be formed between the second blocking layer (BSM-2) and the second semiconductor pattern 310. A parasitic capacitance having a second capacitance C2 may be formed between the second semiconductor pattern 310 and the second gate electrode 330.

As the second source region and the second drain region, which are ends of the second semiconductor pattern 310, are doped with impurities, a parasitic capacitance with a third capacitance CACT is formed inside the second semiconductor pattern 310 when a voltage is applied to the semiconductor pattern.

In the light emitting display device according to the embodiment of the present specification, a change amount of an effective gate voltage that affects a driving current applied to the light emitting element layer may be determined by the following equation.

$$\Delta V_{eff} = \frac{C2}{C2 + C_{ACT} + C1} \times \Delta V_{GAT} \quad \text{[Equation 1]}$$

$\Delta V_{eff}$ means a change amount of an effective gate voltage (or effective voltage), and may be a voltage actually applied to a channel of the second semiconductor pattern 310. $\Delta V_{GAT}$ refers to a change amount of the voltage applied to the second gate electrode 330.

Referring to [Equation 1], adjusting the first capacitance C1 formed between the second blocking layer (BSM-2) and the second semiconductor pattern 310 may influence generation of a driving current. For example, since the effective voltage $\Delta V_{eff}$ applied to the channel of the second semiconductor pattern 310 is in inverse proportion to the first capacitance C1, the effective voltage applied to the oxide semiconductor pattern can be adjusted by controlling the first capacitance C1.

$$C = Q/V = \varepsilon_o A/d \quad \text{[Equation 2]}$$

(εo: dielectric permittivity, A: area, d: distance between electrodes)

Referring to [Equation 2], the capacitance increases as a distance between electrodes decreases. Therefore, when a size of the first capacitance C1 is increased by disposing the second blocking layer (BSM-2) close to the second semiconductor pattern 310, an amount of change ΔVeff of a voltage applied to the second semiconductor pattern 310 may be reduced.

The decrease in the change amount Δ of the effective current flowing through the second semiconductor pattern 310 means that a control range of the second thin film transistor 300 that can be controlled through the change amount ΔVGAT of the voltage applied to the second gate electrode 330 widens.

Accordingly, the second vertical distance D2 between the second semiconductor pattern 310 and the second blocking layer (BSM-2) of the second thin film transistor 300 is formed smaller than the first vertical distance D1 between the first semiconductor pattern 210 and the first blocking layer (BSM-1) of the first thin film transistor 200, a range in which the second thin film transistor 300 controls the gray level can be widened. As a result, it is possible to precisely control the light emitting element layer even at a low gray level, such that a problem of screen stains frequently occurring at the low gray level may be solved.

The display device according to the embodiment of the present disclosure may be described as follows.

One embodiment is a light emitting display device, including: a first thin film transistor comprising a first semiconductor pattern, a first gate electrode, a first source electrode, and a first drain electrode; a second thin film transistor comprising a second semiconductor pattern, a second gate electrode, a second source electrode, and a second drain electrode; and a light emitting element layer electrically connected to the second thin film transistor, and the second thin film transistor may further include the second source electrode and an auxiliary metal layer contacting a lower portion of the second drain electrode.

According to an embodiment of the present disclosure, the auxiliary metal layer may include molybdenum.

According to an embodiment of the present disclosure, at least one or more insulating layers having a contact hole may be interposed among the second semiconductor pattern, the second source electrode and the second drain electrode, and the auxiliary metal layer may be in the contact hole.

According to an embodiment of the present disclosure, the second semiconductor pattern, the second source electrode, and the second drain electrode may be electrically connected through the auxiliary metal layer.

According to an embodiment of the present disclosure, the first semiconductor pattern may be made of low-temperature polysilicon, and the second semiconductor pattern may be made of oxide.

According to an embodiment of the present disclosure, the first source electrode, the first drain electrode, the second source electrode, and the second drain electrode may include at least three metal layers.

According to an embodiment of the present disclosure, the light emitting display device may further include: a first blocking layer disposed under the first semiconductor pattern and a second blocking layer disposed under the second semiconductor pattern.

According to an embodiment of the present disclosure, at least one or more buffer layers are interposed between the first blocking layer and the second blocking layer.

According to an embodiment of the present disclosure, a vertical length of the first blocking layer and the first semiconductor pattern may be different from a vertical length of the second blocking layer and the second semiconductor pattern.

According to an embodiment of the present disclosure, a vertical length of the second blocking layer and the second semiconductor pattern may be smaller than a vertical length of the first blocking layer and the first semiconductor pattern.

According to an embodiment of the present disclosure, a material of the first semiconductor pattern and a material of the second semiconductor pattern may be different from each other.

According to an embodiment of the present disclosure, a material of the first source electrode and the first drain electrode may be different from a material of the auxiliary metal layer.

According to an embodiment of the present disclosure, a material of the second source electrode and the second drain electrode may be different from a material of the auxiliary metal layer.

According to an embodiment of the present disclosure, a material of the first source electrode and the first drain electrode may be the same as a material of the second source electrode and the second drain electrode, and a material of the auxiliary metal layer may be different from materials of the first source electrode, the first drain electrode, the second source electrode, and the second drain electrode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but are not intended to limit the technical spirit of the present disclosure. The scope of the technical spirit of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display device, comprising:

a first thin film transistor, the first thin film transistor comprising a first semiconductor pattern, a first gate electrode, a first source electrode, and a first drain electrode;

a second thin film transistor, the second thin film transistor comprising a second semiconductor pattern, a second gate electrode, a second source electrode, and a second drain electrode; and a light emitting element layer electrically connected to the second thin film transistor, wherein the second thin film transistor further comprises a plurality of auxiliary metal layers, wherein the plurality of auxiliary metal layers are in contact with a lower portion of each of the second source electrode and the second drain electrode, wherein the first source electrode and the first drain electrode are disposed in a same layer as the plurality of auxiliary metal layers, and materials of the first source electrode and the first drain electrode are different from a material of the plurality of auxiliary metal layers, and wherein materials of the first source electrode and the first drain electrode are same as materials of the second source electrode and the second drain electrode on the plurality of auxiliary metal layers.

2. The light emitting display device of claim 1, wherein the plurality of auxiliary metal layers comprise molybdenum.

3. The light emitting display device of claim 1, wherein at least one or more insulating layers having a contact hole are interposed among the second semiconductor pattern, the second source electrode and the second drain electrode, and the plurality of auxiliary metal layers are in the contact hole.

4. The light emitting display device of claim 1, wherein the second semiconductor pattern, the second source electrode, and the second drain electrode are electrically connected through plurality of auxiliary metal layers.

5. The light emitting display device of claim 1, wherein the first semiconductor pattern is made of low-temperature polysilicon, and the second semiconductor pattern is made of oxide.

6. The light emitting display device of claim 1, wherein the first source electrode, the first drain electrode, the second source electrode, and the second drain electrode comprise at least three metal layers.

7. The light emitting display device of claim 1, further comprising:

a first blocking layer under the first semiconductor pattern and a second blocking layer under the second semiconductor pattern.

8. The light emitting display device of claim 7, wherein at least one or more buffer layers are interposed between the first blocking layer and the second blocking layer.

9. The light emitting display device of claim 7, wherein a vertical length of the first blocking layer and the first semiconductor pattern is different from a vertical length of the second blocking layer and the second semiconductor pattern.

10. The light emitting display device of claim 7, wherein a vertical length of the second blocking layer and the second semiconductor pattern is smaller than a vertical length of the first blocking layer and the first semiconductor pattern.

11. The light emitting display device of claim 1, wherein a material of the first semiconductor pattern and a material of the second semiconductor pattern are different from each other.

12. The light emitting display device of claim 1, wherein a material of the second source electrode and the second drain electrode is different from a material of the plurality of auxiliary metal layers.

13. The light emitting display device of claim 1, wherein a material of the plurality of auxiliary metal layers is different from materials of the second source electrode and the second drain electrode.

* * * * *